(12) United States Patent
Saimun et al.

(10) Patent No.: US 7,095,621 B2
(45) Date of Patent: Aug. 22, 2006

(54) LEADLESS LEADFRAME ELECTRONIC PACKAGE AND SENSOR MODULE INCORPORATING SAME

(75) Inventors: Lee Saimun, Penang (MY); Gurbir Singh, Penang (MY); Chin Yee Loong, Perak (MY)

(73) Assignee: Avago Technologies Sensor IP (Singapore) Pte. Ltd., (SG)

( * ) Notice: Subject to any disclaimer, the term of this patent is extended or adjusted under 35 U.S.C. 154(b) by 0 days.

(21) Appl. No.: 10/372,908

(22) Filed: Feb. 24, 2003

(65) Prior Publication Data

US 2004/0165356 A1   Aug. 26, 2004

(51) Int. Cl.
*H01R 9/00* (2006.01)

(52) U.S. Cl. .............. 361/772; 361/776; 257/776; 257/777; 257/778

(58) Field of Classification Search ........... 361/715, 361/772, 774, 813, 760, 741, 776; 174/52.2, 174/52.4, 52.3; 257/666, 797, 696, 776–778, 257/680; 438/123–124, 116, 113, 106, 110–111; 29/380
See application file for complete search history.

(56) References Cited

U.S. PATENT DOCUMENTS

| | | | |
|---|---|---|---|
| 4,927,697 A | 5/1990 | Ihill | |
| 4,971,930 A * | 11/1990 | Fusaroli et al. | 438/116 |
| 6,143,981 A | 11/2000 | Glenn | |
| 6,331,451 B1 * | 12/2001 | Fusaro et al. | 438/126 |
| 6,355,502 B1 * | 3/2002 | Kang et al. | 438/106 |
| 6,372,539 B1 * | 4/2002 | Bayan et al. | 438/106 |
| 6,400,004 B1 * | 6/2002 | Fan et al. | 257/666 |
| 6,448,107 B1 * | 9/2002 | Hong et al. | 438/106 |
| 6,524,886 B1 * | 2/2003 | Lee | 438/106 |
| 6,525,405 B1 * | 2/2003 | Chun et al. | 257/666 |
| 6,526,653 B1 * | 3/2003 | Glenn et al. | 29/830 |
| 6,815,833 B1 * | 11/2004 | Lee et al. | 257/778 |
| 6,875,630 B1 * | 4/2005 | Kasahara et al. | 438/106 |
| 6,930,377 B1 * | 8/2005 | Bayan | 257/684 |

* cited by examiner

*Primary Examiner*—Kamand Cuneo
*Assistant Examiner*—Hung S. Bui

(57) ABSTRACT

A leadless optical electronic package includes a lead frame having a die-attach pad and a plurality of leadless connection pads encapsulated in and extending through an encapsulation defining a planar mounting surface that can be soldered directly to a circuit board. The die-attach pad and connection pads define internal surfaces that remain partially exposed through the encapsulation. The internal surfaces are for attaching an electronic die and making electrical connections between the die and the connection pads. A die mounted on the die-attach pad is cooled more effectively and efficiently than dice in prior optical electronic packages. The leadless connection pads reduce the footprint and height of the package compared with prior optical electronic packages. The encapsulation is adapted for receiving a cover having a cover glass to allow light to pass though the cover and illuminate the die. The cover is adapted to receive an optics component for projecting light through the cover glass onto the die.

8 Claims, 3 Drawing Sheets

LEADLESS LEADFRAME ELECTRONIC PACKAGE AND SENSOR MODULE INCORPORATING SAME

TECHNICAL FIELD OF THE INVENTION

This invention relates to packaging of electronic components, and more particularly to packaging an optical image capture sensor of the type used in digital cameras.

BACKGROUND OF THE INVENTION

Image capture devices, such as digital cameras, typically include an optical image capture sensor that converts an image focused onto the sensor into an electrical signal, and an optical component having a lens for focusing the image onto sensor.

Optical image capture sensors of the type used in digital cameras are typically provided in the form of a monolithic electronic chip, known as an optical sensor die. The optical sensor die is typically mounted in a package that provides support and protection to the die, and includes electrical contacts, or leads, for connecting the die to an electrical circuit board. The package, with the die installed, is typically combined with optical components having lenses to focus light on the die to form an optical sensor module that is attached to a circuit board inside the camera.

The lenses in such optical sensor modules are typically formed from a thermoplastic material, such as an optical grade of polycarbonate having a low melting temperature, rather than glass, to minimize the cost of producing the lenses. These thermoplastic materials typically have a melting temperature of about 150°Celsius (C.). One type of polycarbonate material used for the lenses in optical sensor modules is sold by the General Electric Company under the trade name LEXAN®.

Although it would be desirable for minimizing the size and cost of the module, and for effectively and efficiently removing heat from the sensor die, to solder the module directly to the circuit board using a high-volume production process such as solder reflow, the thermoplastic materials used for forming the lenses cannot withstand the temperatures in the range of 220° to 260° C. that are required for melting the solder to join a module to a circuit board using such processes.

This inability of the lenses to withstand the temperature that would be generated in soldering the module directly to the circuit board has necessitated the use of intermediate coupling devices for electrically connecting and physically mounting the module on the circuit board.

In one commonly used mounting approach, a socket is soldered to the circuit board. The optical sensor module is inserted into the socket, subsequent to the soldering operation, to establish electrical contact and provide physical support of the module. This approach does not allow the module to be miniaturized due to the need for the socket, and connection features on the module that are required for engaging electrical contacts in the sockets and for retaining the module in the socket.

In another commonly used approach, a connector for a flex connection is soldered directly to the circuit board. A flex circuit or cable is then used for electrically connecting the module to the connector on the circuit board. The module is then mechanically attached and supported on the circuit board by a mounting device. This approach also does not allow for the module to be miniaturized, due to the need for the connector, the flex connection, and the module mounting device.

Using a socket or a flex connection for mounting the module on the circuit board are also undesirable because the type of packages typically used in these approaches, for housing optical image capture sensor dies, do not provide for efficient and effective removal of heat generated in the optical sensor die.

It would be desirable to utilize a relatively new type of electronic package technology, known as a Leadless Leadframe Package (LLP) for packaging an optical image capture sensor of the type used in digital cameras. In an LLP, a metal lead frame substrate is formed by a process such as chemical etching from a thin sheet of metal (typically copper). The LLP includes at least one cut-out extending between parallel internal an external surfaces of the lead frame, with the cut-out forming a die-attach pad and one or more leadless connection pads. A die is mounted on the die-attach surface, and wire bonds or other types of electrical connections are made between the die and the internal surfaces of the connection pads. An electrically insulating encapsulating material is then molded around the lead frame, die and wire bonds. After the encapsulation is cured, the LLP is trimmed to final shape. U.S. Pat. No. 6,143,981, to Glenn, and U.S. Pat. No. 6,372,539 B1, to Bayan, et al, disclose LLP electronic packages of the type described above.

An LLP differs from other types of lead frame based packages in that there are no metal leads extending from the finished LLP for insertion into or attachment to pads on a printed wiring board (PWB). In an LLP, the connection pads are used for forming a leadless connection by applying a ball of solder crème or paste between the connection pads of the LLP and mating pads on the PWB, and subjecting the PWB to a process such as solder reflow. U.S. Pat. No. 4,927,697, to IHill, describes a method for attaching and LLP to a PWB.

Prior LLP packages are not amenable, however, to packaging an optical image capture sensor of the type used in digital cameras. The performance of an image capture sensors is so seriously degraded by even minute particles of dust, interfering with an image reaching the surface of the sensor, that electronic packages containing optical image capture sensors must be assembled in closely controlled clean room environments. The structure and encapsulation typically used in prior LLP modules would interfere with the image capture sensor receiving the image in sufficient detail.

What is needed is an improved apparatus and method for mounting an optical image capture sensor die on a printed wiring board, preferably through the use of an LLP-type package.

SUMMARY OF THE INVENTION

The invention provides an improved leadless electronic package for mounting a wide variety of electronic dies, including optical image capture sensor dies, on a printed wiring board using common high-production methods, such as solder reflow.

In one embodiment of the invention a leadless lead frame electronic package (LLP) includes a lead frame of thermally-and-electrically-conductive material encapsulated in an encapsulation of electrically-insulating material to define a planar mounting surface. The lead frame includes parallel internal and external planar surfaces. The external planar surface of the lead frame remains exposed through the encapsulation and extends generally co-planar with the mounting surface. The internal surface of the lead frame remains partially exposed through the encapsulation.

The LLP may also include an attachment element structured to engage with an optical component. The LLP may further include an optical component.

According to one aspect of the invention, the lead frame includes at least one cut-out extending from the internal surface to the external surface to define a die-attach pad and at least one connection pad electrically isolated from the die-attach pad. The die-attach pad and the at least one connection pad(s) extends through the encapsulation. A portion of the external surface of the die-attach pad and a portion of the external surface of each the connection pads is exposed and is generally coplanar with the encapsulation. A portion of the internal surfaces thereof respectively defines an exposed die-attach surface and an exposed bond-connection surface.

The leadless electronic package may include a sidewall of electrically-insulating material extending above the inside surface of the lead frame to form a die-receiving cavity in the electronic package. The package may further include a cover adapted for engaging the sidewall and having a cover glass therein for admitting light into the die-receiving cavity. The package may yet further include an optical component, and an attachment element for attaching the optical component on the encapsulation.

The invention may also take the form of an optical sensor module including an optical sensor die attached to the internal planar surface of the lead frame of a package as described above.

The invention may also take the form of a method for attaching an optical sensor module to a circuit board by providing an optical sensor module including an optical sensor die attached to an internal planar surface of a lead frame of a leadless electronic package as described above, and soldering a portion of the exposed external surface of the lead frame to the circuit board. According to one aspect of the invention, the method includes attaching an optical component to the optical sensor module after the module has been soldered to the circuit board.

The foregoing and other features and advantages of the invention are apparent from the following detailed description of exemplary embodiments, read in conjunction with the accompanying drawing. The detailed description and drawing are merely illustrative of the invention rather than limiting, the scope of the invention being defined by the appended claims and equivalents thereof.

DETAILED DESCRIPTION

Figure 1:
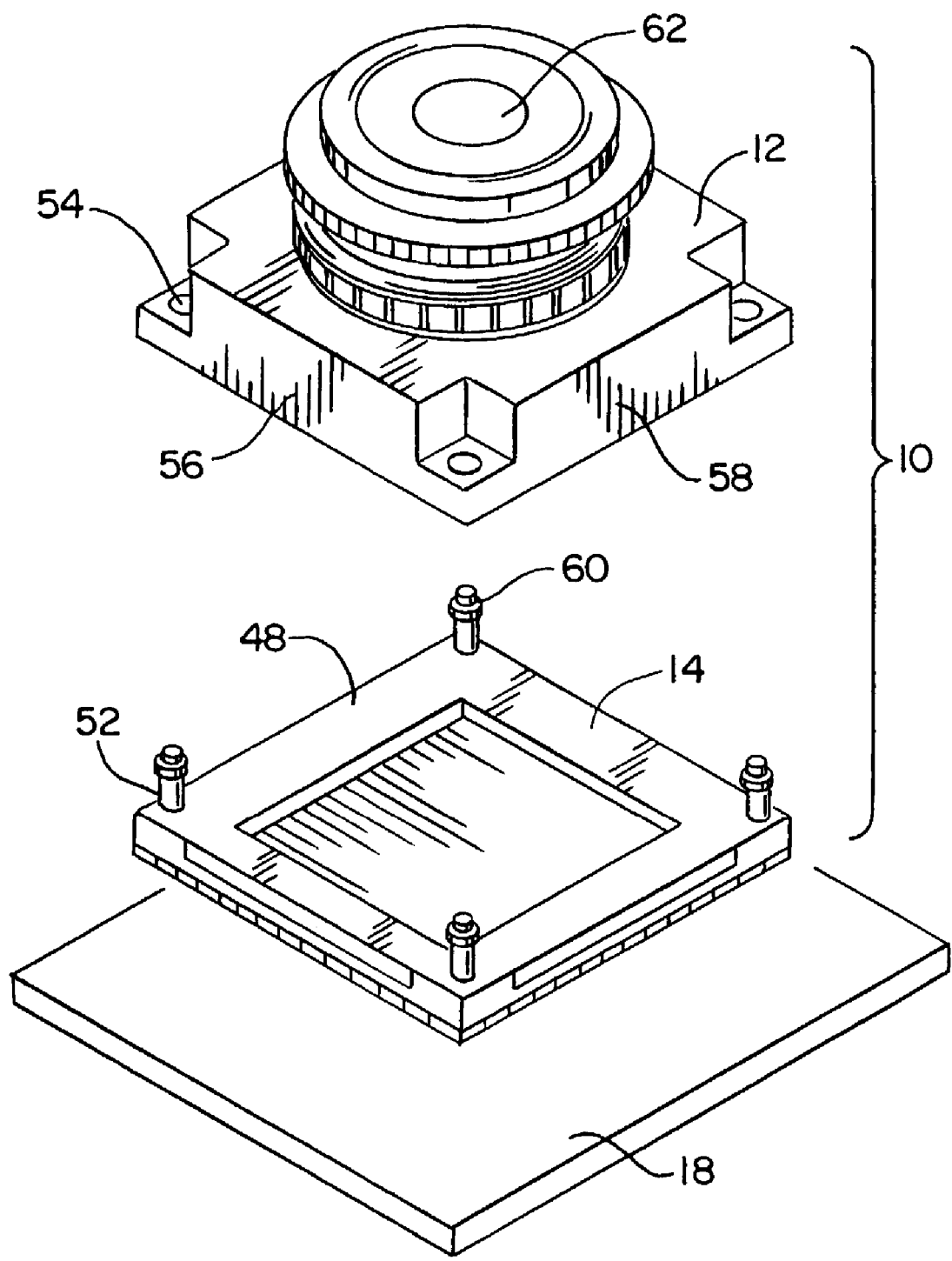
FIG. 1 is a perspective view of an exemplary embodiment of an optical sensor module, according to the invention.
Figure 2:
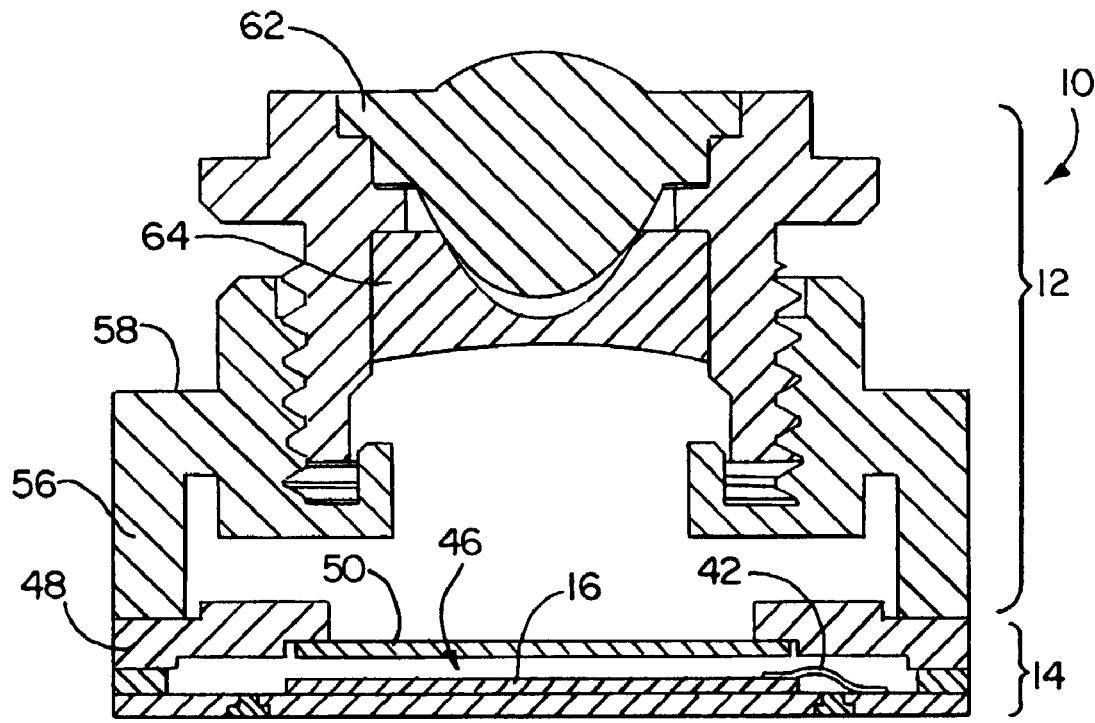
FIG. 2 is a cross sectional view of the exemplary embodiment of the optical sensor module of FIG. 1.

FIGS. 1 and 2 show an exemplary embodiment of an optical sensor module 10, according to the invention, having an optical component 12 and an electronic package 14 containing an optical image capture sensor die 16. The electronic package 14 is a leadless, lead frame based, quad, flat package that can be soldered directly to a circuit board 18 prior to attaching the optical component 12, to thereby preclude damaging lens elements 62, 64 of the optical component 12 during soldering operations.

Figure 3:
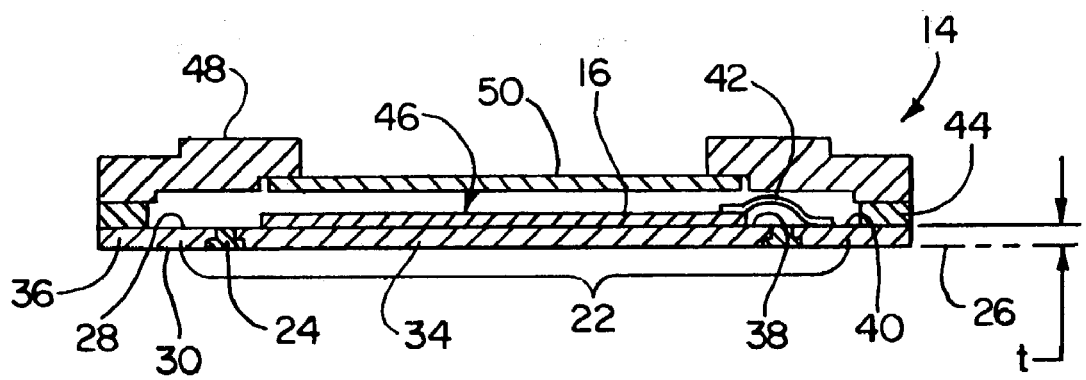
FIG. 3 is a cross sectional view of the exemplary embodiment of a leadless, lead frame electronic package, according to the invention, and forming part of the optical sensor module of FIGS. 1 and 2.
Figure 4:
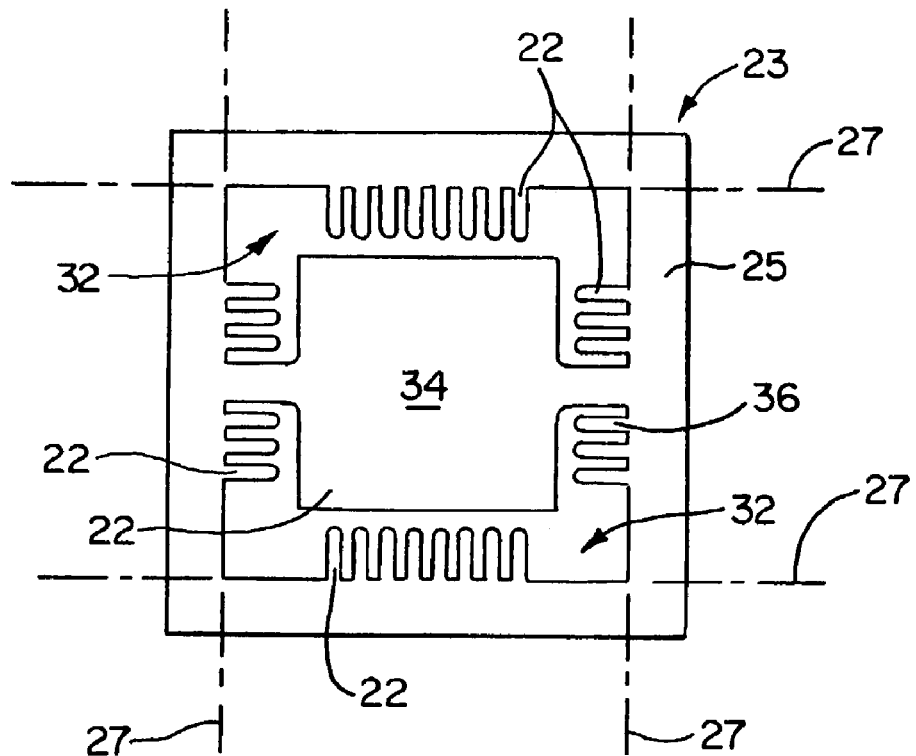
FIG. 4 is a bottom view of a lead frame blank used to form the lead frame of the exemplary embodiment of the package of FIG. 3.
Figure 5:
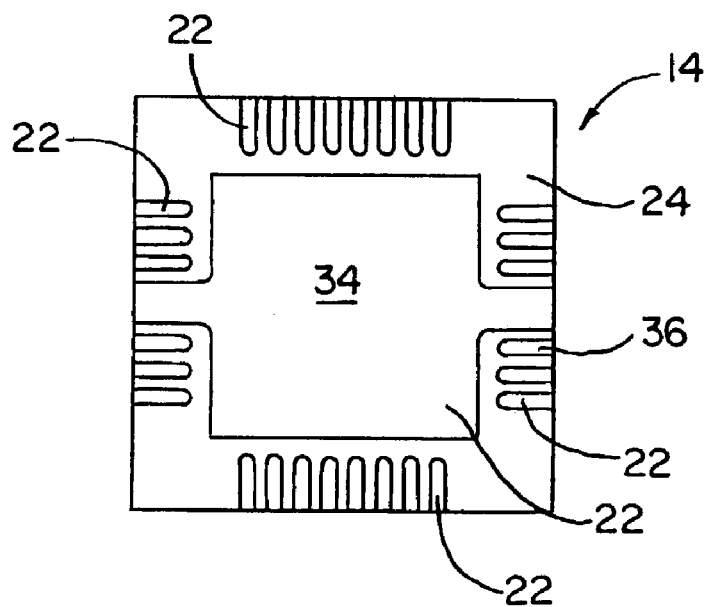
FIG. 5 is a bottom view of the leadless electronic package of FIG. 3.

As shown in FIGS. 3–5, the electronic package 14 includes a lead frame 22 of a thermally and electrically conductive material such as copper. The lead frame 22 is encapsulated in an encapsulation 24 of electrically insulating material defining a planar mounting surface 26 of the package 14. The lead frame 22 has substantially parallel internal and external planar surfaces 28, 30, separated from one another by a thickness t of the lead frame 22. The external planar surface 30 of the lead frame 22 is exposed through the encapsulation 24 and extends generally coplanar with the mounting surface 26. The internal surface 28 of the lead frame 22 is left partially exposed through the encapsulation 24.

The package 14 is fabricated by forming a lead frame blank 23, as shown in FIG. 4, having an outer rim 25 interconnecting the a die pad 34 and a plurality of leadless connection pads 36 of the lead frame 22. After the lead frame blank 23 is encapsulated in the encapsulation 24, the rim 25 and any portion of the encapsulation 24 extending beyond the lead frame 22 is cut away by sawing or otherwise cutting the package 14 along cutting lines 27, to produce the final package 14 as shown in FIG. 5.

To facilitate high volume production, the lead frames 22 of a number of packages may be joined together by shared rims 25 to form a common lead frame. The common lead frame is encapsulated as a unit and cut apart to form separate packages after being encapsulated. Forming the package 14 in this manner greatly reduces the amount of labor that would be required to individually form a large number of packages 14.

As shown in FIG. 4 the lead frame 22 includes cutouts 32 extending through the thickness t of the lead frame 22 from the internal to the external surfaces 28, 30. The cutouts 32 divide the lead frame 22 into a die-attach pad 34 and a plurality of connection pads 36 that become electrically isolated from the die-attach pad 34 when the rim 25 is removed. Each of the connection pads 36 and the die-attach pad 34 retains a portion of the internal and external surfaces 28, 30 of the lead frame 22. As shown in FIGS. 3 and 5, the encapsulation 24 extends through the cutouts 32.

The die-attach pad 34 and the bond-connection pads 36 extend through the encapsulation 24. The external surfaces 30 of the die-attach pad 34 and the connection pads 36 are exposed, and are coplanar with the mounting surface 26 of the encapsulation 24.

As shown in FIG. 3, an exposed portion of the internal surface 28 of the die-attach pad 34 constitutes an exposed die-attach surface 38. An exposed portion of each of the connection pads 36 constitutes an exposed bond-connection surface 40 of the connection pad 36. The optical image capture sensor die 16 is attached to the die-attach surface 38 of the die-attach pad 34, preferably using a thermally conductive adhesive or solder. Wire bonds 42 electrically connect the die 16 to the bond-connection surfaces 40 of the connection pads 36.

As shown in FIG. 3, the package 14 further includes a sidewall 44 extending above the inside surface 28 to form a die-receiving cavity 46 in the electronic package 14. The sidewall 44 can be formed integrally with the encapsulation 24, as shown in FIGS. 2 and 3, or formed separately and bonded to the encapsulation 24. The package 14 also includes a cover 48 that engages with the sidewall 44 of electrically insulating material and includes a cover glass 50 therein to admit light into the die-receiving cavity 46. The cover 48 is attached to the sidewall 44 with an adhesive, after the optical sensor die 16 has been attached to the die-attach pad 34 and the wire bonds 42 are connected between the die 16 and the die-connecting surfaces 40 of the connection pads 22. With the cover 48 attached, the package 14 protects the die 16 during subsequent handling of the package 14 and soldering of the package 14 to the circuit board 18.

The encapsulation 24, and the cover 48 are preferably made from a material that can withstand soldering temperatures of 220° to 260° C. The encapsulation 24 and cover 48 are also preferably formed by an insert molding process, using a thermoset material such as Bakelite, having a melting temperature higher than 260° C. Bakelite materials such as those marketed under designations or 6650R, and 6300SF, by Sumitomo, Co. Ltd., of Japan are well suited for use in forming the encapsulation 24 in an LLP according to the invention.

To form the package 14 by insert molding, the lead frame 22, without the die 16 or wire bonds 42, is placed into a mold. The mold is then closed, and a measured volume of thermoset material is injected into the closed mold under pressure. After the mold has cooled, and the injected thermoset material has hardened, the mold is opened and the encapsulated lead frame 22 is removed. The mold is structured to leave portions of the internal and external surfaces 28, 30 of the lead frame 22 exposed through the molded thermoset material to form the die-attach surface 38 and the bond-connection surfaces 40.

As shown in FIG. 1, the package 14 includes four attachment elements, in the form of pins 52 formed integral with and extending from the cover 48, for engaging alignment holes 54 in a skirt 56 of a housing 58 of the optical component 12. The distal ends of the attachment pins 52 are slotted and have an enlarged outer profile 60 so that the end of the pins 52 can compress radially as they pass through the holes 54, and then expand radially outward to lock the optical component 12 onto the package 14. The attachment elements can be provided in a virtually unlimited number of other forms, including screws, rivets, stakes or locking tabs.

The invention also provides a method for attaching an optical sensor die 16 to a circuit board 18. The method includes constructing an optical sensor module 10 including an LLP package 14 having a partially exposed external surface 30, as described above, and soldering at least part of the exposed external surface 30 of the lead frame 22 to the circuit board 18. The method may also include attaching an optical component 12 to the LLP package 14 of the optical sensor module 10, after the LLP package 14 is soldered to the circuit board 18.

Because the optical component 12 can be readily attached to the package 14 after the package 14 has been soldered to the circuit board 18, materials such as a thermoplastic optical grade of polycarbonate having a low cost and low melting temperature can be used to form lens elements 62, 64 of the optical component 12. When the optical component 12 is mounted as shown in FIGS. 1 and 2, light received via the optical component 12 is projected through the cover glass 50 onto the optical sensor die 16 in the cavity 46 of the package 14.

While the embodiments of the invention disclosed herein are presently considered to be preferred, various changes and modifications can be made without departing from the spirit and scope of the invention. The various elements and aspects of the invention may be used independently from one another, or in different combinations than are described above and in the drawings with regard to the exemplary embodiments.

The scope of the invention is indicated in the appended claims. It is intended that all changes or modifications within the meaning and range of equivalents are embraced by the claims.

We claim:

1. A leadless lead frame electronic package (LLP), comprising:
    a lead frame of thermally and electrically conductive material encapsulated in an encapsulation of electrically-insulating material to define a planar mounting surface;
    wherein the lead frame includes an internal planar surface defined by the conductive material and the encapsulating insulating material and an external planar surface also defined by the conductive material and the encapsulating insulating material, the internal planar surface and the external planar surface being parallel to each other,
    wherein a portion of the lead frame defines a die attach pad, the die attach pad having an internal surface and external surface;
    wherein the die attach pad internal planar surface is coplanar with the internal planar surface of the lead frame and the die attach pad external surface is coplanar with external planar surface of the lead frame;
    wherein other portions of the lead frame define a plurality of connection pads electrically isolated from the die attached pad, each connection pad has an internal surface and an external surface;
    wherein connection pad internal surface is coplanar with internal planar surface of the lead frame and an external surface coplanar with external planar surface of the lead frame; and
    wherein the external planar surface of the lead frame is coplanar with the planar mounting surface such that the leadless lead frame electronic package (LLP) provides for a coplanar contact areas for the die attach pad and the connection pads whereby need for metal leads extending from the lead frame is eliminated.

2. The electronic package of claim 1 including an attachment element adapted to engage with an optical component.

3. The electronic package of claim 1, further including an optical component.

4. The electronic package of claim 1 further comprising a sidewall of electrically insulating material extending above the internal surface of the lead frame to form a die-receiving cavity in the electronic package.

5. The electronic package of claim 4 further comprising an optical sensor die attached to the die attach pad within the die receiving cavity.

6. The electronic package of claim 4, further comprising, a cover adapted for engaging the sidewall and having a cover glass mounted therein.

7. The electronic package of claim 6, further comprising an attachment element structured to engage with an optical component.

8. The electronic package of claim 7, further comprising, an optical component.

* * * * *